(12) United States Patent
Awujoola et al.

(10) Patent No.: US 9,490,222 B1
(45) Date of Patent: Nov. 8, 2016

(54) WIRE BOND WIRES FOR INTERFERENCE SHIELDING

(71) Applicant: Invensas Corporation, San Jose, CA (US)

(72) Inventors: Abiola Awujoola, Pleasanton, CA (US); Zhuowen Sun, Campbell, CA (US); Wael Zohni, San Jose, CA (US); Ashok S. Prabhu, San Jose, CA (US); Willmar Subido, Garland, TX (US)

(73) Assignee: Invensas Corporation, San Jose, CA (US)

( * ) Notice: Subject to any disclaimer, the term of this patent is extended or adjusted under 35 U.S.C. 154(b) by 0 days.

(21) Appl. No.: 14/880,967

(22) Filed: Oct. 12, 2015

(51) Int. Cl.
*H01L 23/552* (2006.01)
*H01L 23/00* (2006.01)

(52) U.S. Cl.
CPC ............ *H01L 23/552* (2013.01); *H01L 24/06* (2013.01); *H01L 24/48* (2013.01); *H01L 24/49* (2013.01); *H01L 2224/04042* (2013.01); *H01L 2224/48105* (2013.01); *H01L 2224/4942* (2013.01); *H01L 2924/1205* (2013.01); *H01L 2924/1206* (2013.01); *H01L 2924/1207* (2013.01); *H01L 2924/3025* (2013.01)

(58) Field of Classification Search
CPC ............... H01L 24/49; H01L 23/5225; H01L 2924/3025; H01L 24/48
USPC ......................... 257/659, 686, 777
See application file for complete search history.

(56) References Cited

U.S. PATENT DOCUMENTS

| | | | |
|---|---|---|---|
| 7,198,987 B1 | 4/2007 | Warren et al. | |
| 7,344,917 B2 | 3/2008 | Gautham | |
| 7,576,415 B2 * | 8/2009 | Cha | H01L 23/29 257/659 |
| 7,659,617 B2 | 2/2010 | Kang et al. | |
| 8,071,424 B2 | 12/2011 | Haba et al. | |
| 8,071,431 B2 | 12/2011 | Hoang et al. | |
| 8,115,283 B1 * | 2/2012 | Bolognia | B81B 7/0064 257/659 |
| 8,399,972 B2 | 3/2013 | Hoang et al. | |
| 8,669,646 B2 * | 3/2014 | Tabatabai | H01L 23/552 257/659 |
| 8,916,781 B2 | 12/2014 | Haba et al. | |
| 8,978,247 B2 | 3/2015 | Yang et al. | |
| 8,988,895 B2 | 3/2015 | Mohammed et al. | |
| 9,196,588 B2 | 11/2015 | Leal | |
| 2008/0073756 A1 * | 3/2008 | Heitzer | H01L 23/552 257/659 |
| 2012/0306061 A1 * | 12/2012 | Tabatabai | H01L 23/552 257/659 |
| 2013/0328178 A1 * | 12/2013 | Bakalski | H01L 23/5225 257/659 |
| 2016/0043813 A1 * | 2/2016 | Chen | H04B 1/44 257/659 |

FOREIGN PATENT DOCUMENTS

JP     2004047702 A     2/2004

* cited by examiner

Primary Examiner — S. V. Clark

(57) ABSTRACT

Apparatuses relating generally to a microelectronic package having protection from interference are disclosed. In an apparatus thereof, a substrate has an upper surface and a lower surface opposite the upper surface and has a ground plane. A first microelectronic device is coupled to the upper surface of the substrate. Wire bond wires are coupled to the ground plane for conducting the interference thereto and extending away from the upper surface of the substrate. A first portion of the wire bond wires is positioned to provide a shielding region for the first microelectronic device with respect to the interference. A second portion of the wire bond wires is not positioned to provide the shielding region. A second microelectronic device is coupled to the substrate and located outside of the shielding region. A conductive surface is over the first portion of the wire bond wires for covering the shielding region.

20 Claims, 12 Drawing Sheets

WIRE BOND WIRES FOR INTERFERENCE SHIELDING

FIELD

The following description relates generally to wire bond wires for vertical interconnection and/or interference shielding.

BACKGROUND

Microelectronic assemblies generally include one or more ICs, such as for example one or more packaged dies ("chips") or one or more dies. One or more of such ICs may be mounted on a circuit platform, such as a wafer such as in wafer-level-packaging ("WLP"), printed board ("PB"), a printed wiring board ("PWB"), a printed circuit board ("PCB"), a printed wiring assembly ("PWA"), a printed circuit assembly ("PCA"), a package substrate, an interposer, or a chip carrier. Additionally, one IC may be mounted on another IC. An interposer may be a passive or an active IC, where the latter includes one or more active devices, such as transistors for example, and the former does not include any active device but may include one or more passive devices, such as capacitors, inductors, and/or resistors. Furthermore, an interposer may be formed like a PWB, namely without any circuit elements, such as without any passive or active devices. Additionally, an interposer may include at least one through-substrate-via.

An IC may include conductive elements, such as pathways, traces, tracks, vias, contacts, pads such as contact pads and bond pads, plugs, nodes, or terminals for example, that may be used for making electrical interconnections with a circuit platform. These arrangements may facilitate electrical connections used to provide functionality of ICs. An IC may be coupled to a circuit platform by bonding, such as bonding traces or terminals, for example, of such circuit platform to bond pads or exposed ends of pins or posts or the like of an IC; or an IC may be coupled to a circuit platform by soldering. Additionally, a redistribution layer ("RDL") may be part of an IC to facilitate a flip-chip configuration, die stacking, or more convenient or accessible position of bond pads for example.

Some passive or active microelectronic devices may be shielded from electric-magnetic interference ("EMI") and/or radio frequency interference ("RFI"). However, conventional shielding may be complicated to fabricate, too heavy for some mobile applications, and/or too large for some low-profile applications. Moreover, some shielding may not be suitable for a stacked die or stacked package, generally referred to as three-dimensional ("3D") ICs or "3D ICs."

Accordingly, it would be desirable and useful to provide interference shielding that provides an improvement over conventional interference shielding.

BRIEF SUMMARY

An apparatus relates generally to a microelectronic package having protection from interference. In such an apparatus, a substrate has an upper surface and a lower surface opposite the upper surface and has a ground plane. A first microelectronic device is coupled to the upper surface of the substrate. Wire bond wires are coupled to the ground plane for conducting the interference thereto and extending away from the upper surface of the substrate. A first portion of the wire bond wires is positioned to provide a shielding region for the first microelectronic device with respect to the interference. A second portion of the wire bond wires is not positioned to provide the shielding region. A second microelectronic device is coupled to the substrate and located outside of the shielding region. A conductive surface is over the first portion of the wire bond wires for covering the shielding region.

An apparatus relates generally to another microelectronic package having protection from interference. In such an apparatus, a substrate has an upper surface and a lower surface opposite the upper surface and has a ground plane. A microelectronic device is coupled to the upper surface of the substrate. Wire bond wires are bonded to and extend away from the upper surface of the substrate. A first portion of the wire bond wires have a first height and are positioned proximate to and around the first microelectronic device for providing a shielding region for the first microelectronic device with respect to the interference. The first portion of the wire bond wires are coupled to the ground plane for conducting the interference thereto. A second portion of the wire bond wires have a second height, which is less than the first height, and are positioned proximate to and around the first microelectronic device. The second portion of the wire bond wires include signal wires for electrically coupling the microelectronic device with the substrate. A conductive surface is over the wire bond wires for covering the shielding region. Upper ends of the first portion of the wire bond wires are mechanically coupled to the conductive surface.

An apparatus relates generally to yet another microelectronic package having protection from interference. In such an apparatus, a substrate has an upper surface and a lower surface opposite the upper surface and has a ground plane. A first microelectronic device is coupled to the upper surface of the substrate. Lower ends of wire bond wires are coupled to the ground plane for conducting the interference thereto. A first portion of the wire bond wires is positioned to provide a shielding region for the first microelectronic device with respect to the interference. A second portion of the wire bond wires is not positioned to provide the shielding region. A second microelectronic device is coupled to the substrate and located outside of the shielding region. A conductive surface has the first portion of the wire bond wires coupled thereto. The conductive surface covers the shielding region and defines the shielding region with the first portion of the wire bond wires extending away from the conductive surface.

BRIEF DESCRIPTION OF THE DRAWING(S)

Accompanying drawing(s) show exemplary embodiment(s) in accordance with one or more aspects of exemplary apparatus(es) or method(s). However, the accompanying drawings should not be taken to limit the scope of the claims, but are for explanation and understanding only.

DETAILED DESCRIPTION

In the following description, numerous specific details are set forth to provide a more thorough description of the specific examples described herein. It should be apparent, however, to one skilled in the art, that one or more other examples or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Interference may be electric-magnetic interference ("EMI") and/or radio frequency interference ("RFI"). The following description of interference shielding may be used for either or both of these types of interference. However, for purposes of clarity by way of example and not limitation, generally only shielding from EMI is described below in additional detail.

Figure 1A:
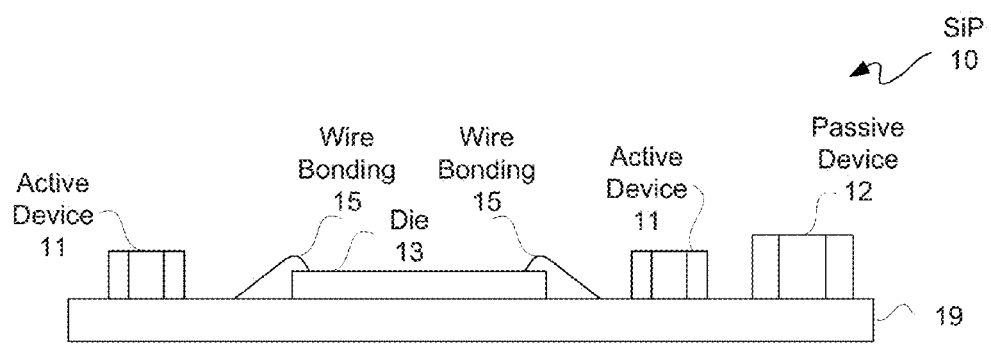
FIG. 1A is a block diagram of a side view depicting an exemplary conventional system-in-package ("SiP") without electric-magnetic interference ("EMI") shielding.

FIG. 1A is a block diagram of a side view depicting an exemplary conventional system-in-package ("SiP") 10 without EMI shielding. In SiP 10, there may be coupled to a package substrate 19 one or more active microelectronic devices 11, passive microelectronic devices 12, and/or IC dies 13. In this example, IC die 13, which may be a passive or active die, may be subject to EMI. IC die 13 may be wire bonded to package substrate 19 with wire bonds 15 for carrying input/output among other signals, a power supply voltage and ground reference.

Package substrate 19 may be formed of thin layers called laminates or laminate substrates. Laminates may be organic or inorganic. Examples of materials for "rigid" package substrates include an epoxy-based laminate such as FR4 or FR5, a resin-based laminate such as bismaleimide-triazine ("BT"), a ceramic substrate (e.g. a low temperature co-fired ceramic (LTCC)), a glass substrate, or other form of rigid package substrate. Moreover, a package substrate 19 herein may be a PCB or other circuit board. Other known details regarding conventional SiP 10 are not described for purposes of clarity.

Figure 1B:
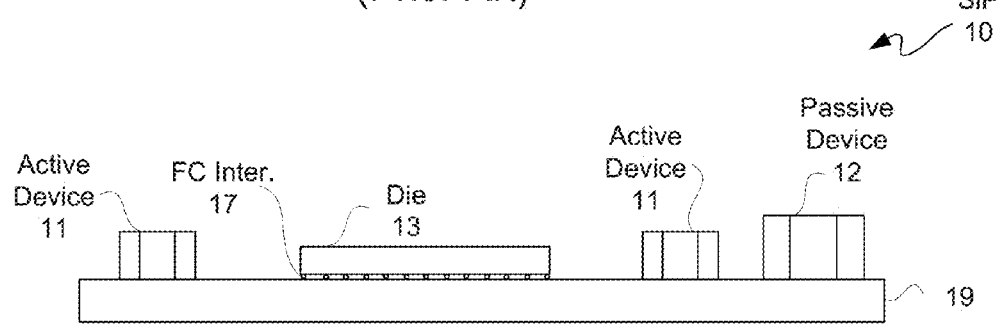
FIG. 1B is a block diagram of a side view depicting another exemplary conventional SiP without EMI shielding.

FIG. 1B is a block diagram of a side view depicting another exemplary conventional SiP 10 without EMI shielding. SiP 10 of FIG. 1B is the same as SiP 10 of FIG. 1A, except rather than wire bonds 15, flip-chip ("FC") interconnects, such as microbumps, 17 are used. Even though microbump interconnects 17 are illustratively depicted, other types of die-surface mount interconnects may be used. Moreover, microbump interconnects 17 may be used in addition to wire bonds 15, though not illustratively depicted in FIG. 1B.

Figure 2:
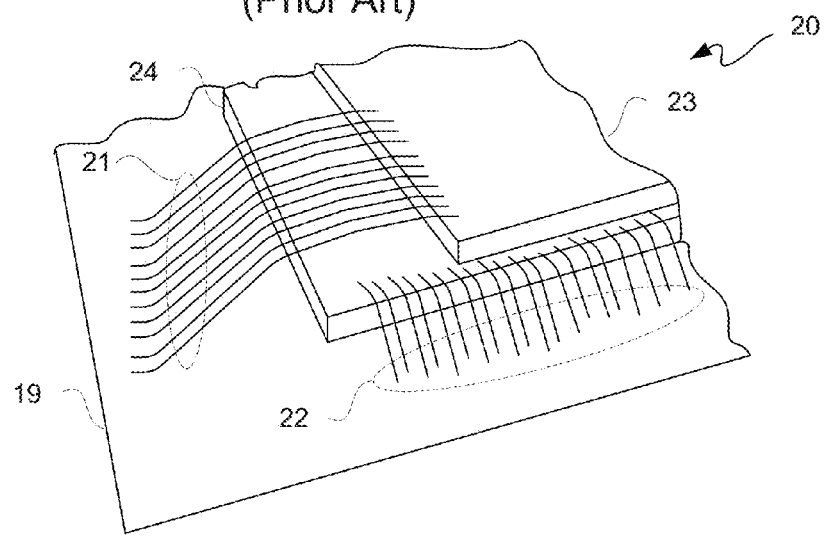
FIG. 2 is a corner top-down perspective view depicting an exemplary portion of a conventional EMI shielding.

FIG. 2 is a corner top-down perspective view depicting an exemplary portion of a conventional EMI shielding 20. In conventional EMI shielding 20, a top electrically conductive plate 23 may be disposed over a bottom conductive plate 24, where such bottom conductive plate 24 has a larger surface area than such top conductive plate 23.

Conductive plates 23 and 24 may be respectively coupled to a package substrate 19 with rows of wire bonds 21 and 22. Thus, two sides of top plate 23 may be wire bonded with corresponding rows of wire bonds 21, and likewise two sides of bottom plate 24 may be wire bonded with corresponding rows of wire bonds 22. Non-electrically conductive spacers (not shown) may be used to insulate wire bonds 21 from bottom conductive plate 24. A microelectronic device (not shown) to be EMI shielded may be sandwiched between top and bottom conductive plates 23 and 24. This type of EMI shielding with wire bonding may be too bulky for many applications. Furthermore, there may be gaps on opposite sides with respect to wire bonds providing side EMI shielding.

Interference Shielding

Figure 3A:
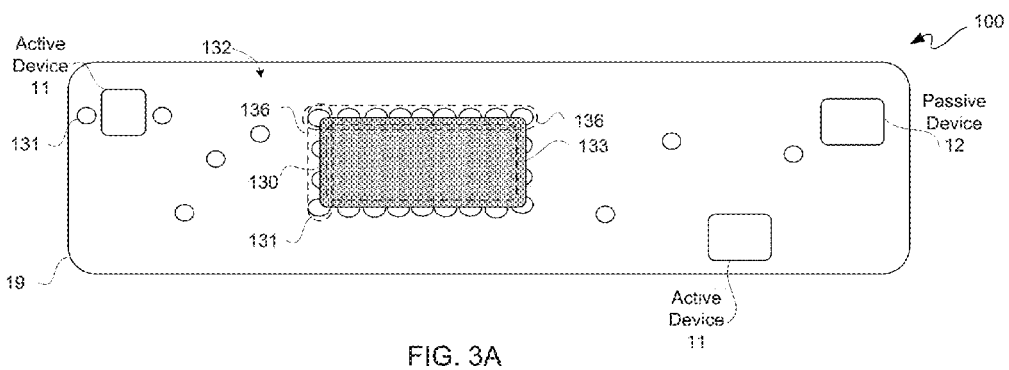
FIGS. 3A and 3B are top views of block diagrams depicting respective exemplary SiPs with EMI shielding.
Figure 3B:
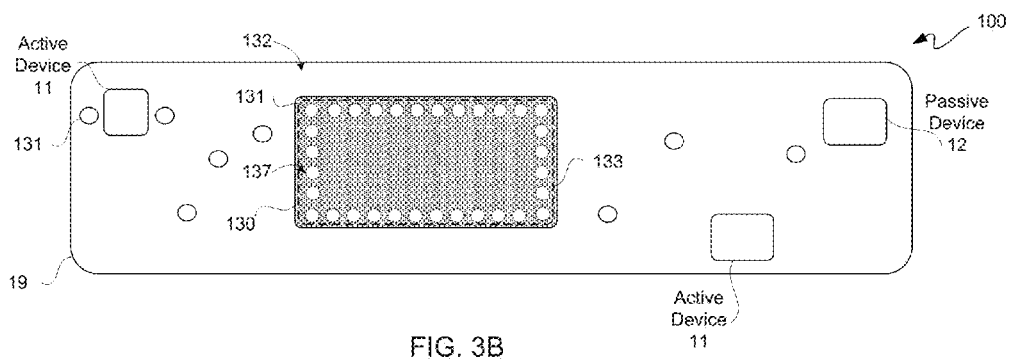

FIGS. 3A and 3B are top views of block diagrams depicting respective exemplary SiPs 100 with EMI shielding. Each of SiPs 100 may include a package substrate 19 having coupled to an upper surface 132 thereof one or more active microelectronic devices 11, one or more passive microelectronic devices 12, and wire bond wires 131, where upper ends of such wire bond wires 131 may be coupled to an upper surface 132. Upper surface 132 may be a conductive surface. Wire bond wires 131 may include wire diameters equal to or less than approximately 0.0508 millimeters (2 mils).

A portion of wire bond wires 131 may be positioned to define a shielding region 133. Along those lines, rows and columns of a BVA arrangement 136 of wire bond wires 131 may be used to encircle or otherwise surround a shielding region 133. Upper ends of at least a subset of such wire bond wires 131 surrounding a shielding region 133 may be used to support conductive surface 130, and such conductive surface 130 may be over such shielding region 133 for covering thereof.

Conductive surface 130 may be a rigid or flexible surface which is electrically conductive. In an implementation, conductive surface 130 may be flexible, such as a flexible conductive coating on a surface of a flexible sheet. In another implementation, a rigid plate may provide a conductive surface. A rigid plate may be made of a conductive material. However, a conductive coating may be sprayed or painted on a rigid plate or flexible sheet. In the example of FIG. 3B, conductive surface 130 may have holes 137 for allowing upper portions of at least some of wire bond wires 131 defining a shielding region 133 to extend through upper surface 130, as described below in additional detail.

Figure 4:
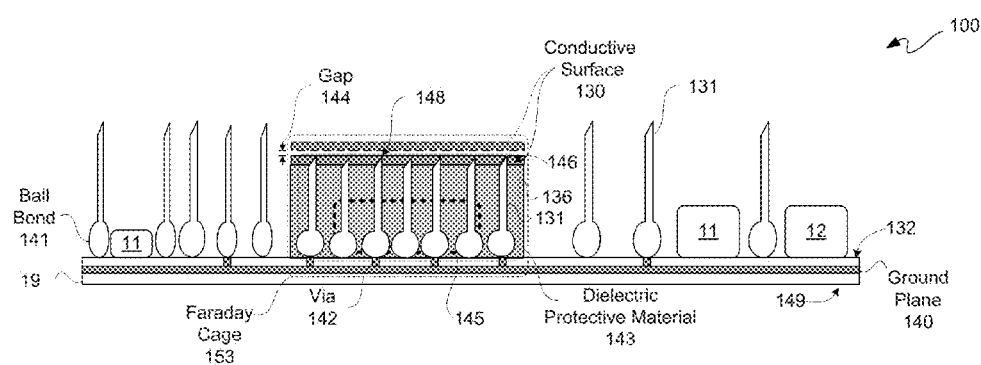
FIG. 4 is a block diagram of a cross-sectional side view depicting an exemplary SiP with EMI shielding.

FIG. 4 is a block diagram of a cross-sectional side view depicting an exemplary SiP 100 with EMI shielding. SiP 100 may include a package substrate 19 having coupled to an upper surface 132 thereof one or more active microelectronic devices 11, one or more passive microelectronic devices 12, and wire bond wires 131, where upper ends of such wire bond wires 131 may be coupled to a conductive surface 130. Even though an SiP 100 is described, another type of microelectronic package having protection from EMI may be used.

Package substrate 19 has an upper surface 132 and a lower surface 149 opposite the upper surface. Package substrate 19 may have located between surfaces 132 and 149 a ground plane 140 and vias 142 interconnected to such ground plane for electrical conductivity.

Wire bond wires 131 may be coupled to ground plane 140 with vias 142. Some wire bond wires 131 may be mechanically coupled to upper surface 132 with ball bonds 141 for electrical conductivity; however, in other implementations, other types of bonding may be used. Moreover, not all wire bond wires 131 need be coupled to ground plane 140. Some wire bond wires 131 may be used for carrying supply voltages or signals within SiP 100. Some wire bond wires 131 may be used for coupling to other devices within SiP 100. However, generally much of the following description is directed at wire bond wires 131 associated with a Faraday cage 153. Along those lines, wire bond wires 131 may be coupled to one or more ground planes for electrically conducting interference thereto.

An active or passive microelectronic device 145 may be coupled to upper surface 132 of package substrate 19. Microelectronic device 145 may include an active integrated circuit die and/or a passive component. A passive component may be a capacitor, an inductor, or a resistor, or any combination thereof.

Microelectronic device 145 may be coupled to package substrate 19 with ball or bump interconnects and/or wire bond wires, as previously described. Moreover, microelectronic device 145 may be coupled to upper surface 132 with an adhesive or an underfill layer (not shown).

Microelectronic device 145 may be disposed in a dielectric protective material 143, such as with an encapsulant or a molding material, for at least covering an upper surface and sidewalls of microelectronic device 145. Wire bond wires 131 may be disposed around sidewalls of microelectronic device 145.

Conductive surface 130 may be located upon or coupled to a top or upper surface 146 of dielectric protective material 143. However, in another implementation a top surface of dielectric protective material 143 may be at a higher level than tips 148 of wire bond wires 131, as described below in additional detail. Conductive surface 130 may be positioned over wire bond wires 131 associated with Faraday cage 153. Upper ends or tips 148 of such wire bond wires 131 may be mechanically coupled to conductive surface 130. This coupling may be with a heated press bonding or other form of mechanical coupling.

Faraday cage 153 may be a combination of a portion of ground plane 140 interconnected to wire bond wires 131, such as with vias 142, supporting a conductive surface 130. In another implementation, there may be a gap 144 between conductive surface 130 and tips 148 of some of wire bond wires 131. Along those lines, a bottom of conductive surface 130, such as of a conductive plate for example, may be attached to or rest upon a top surface of dielectric protective material 143, and height of dielectric protective material 143 may be greater than height of wire bond wires 131.

Thus, a conductive surface 130 may be positioned over a portion of wire bond wires 131 with upper ends or tips 148 thereof spaced apart from conductive surface 130. However, a configuration with a gap 144 may provide a less effective Faraday cage 153, and so for purposes of clarity by way of example and not limitation, it shall be assume that there is no gap.

Wire bond wires 131 coupled to ground plane 140 projecting or extending upwardly away from upper surface 132 of package substrate 19 may be arrayed. Along those lines, even though single rows and columns of a Bond Via Array™ or BVA™ arrangement 136 of wire bond wires 131 may be present in an implementation, multiple rows and/or multiple columns of wire bond wires 131 of a BVA™ arrangement 136, may be present along one or more sides of a shielding region 133.

To recapitulate, some of wire bond wires 131, such as in BVA arrangement 136 defining a shielding region 133, may be positioned to provide such a shielding region 133 for microelectronic device 145 from or with respect to EMI. Another portion of wire bond wires 131 located outside of shielding region 133 may not be used for EMI shielding. Moreover, one or more other active or passive microelectronic devices 11 and/or 12 may be coupled to substrate 19 and be located outside of shielding region 133 and not part of, or position for such shielding region.

Figure 5:
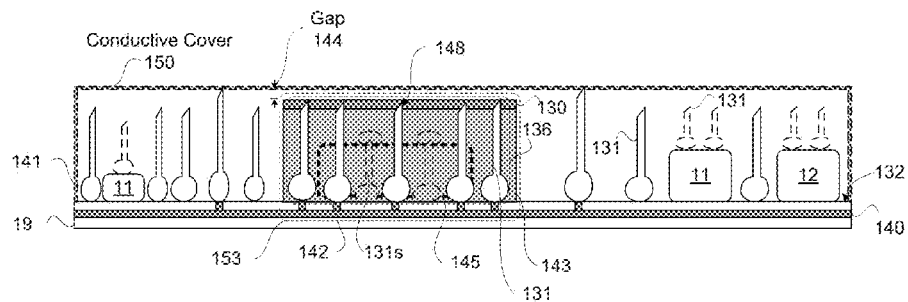
FIG. 5 is a block diagram of a cross-sectional side view depicting an exemplary SiP with a conductive cover and with signal wire bond wires in an EMI shielding region under the conductive cover.

FIG. 5 is a block diagram of a cross-sectional side view depicting an exemplary SiP 100 with a conductive cover 150 and with signal wire bond wires 131*s* in an EMI shielding region under conductive cover 150. SiP 100 of FIG. 5 is the same as SiP 100 of FIG. 4, but with the following differences.

In this example, a portion of wire bond wires 131 have a height that is greater than a height of another portion of wire bond wires 131. Both sets of wire bond wires 131 may be positioned proximate to and around microelectronic device 145. However, the portion of wire bond wires 131 that are taller may be for providing a shielding region 133 for microelectronic device 145 with respect to EMI. Whereas, the other portion of wire bond wires 131 that are shorter ("wire bond wires 131*s*") may be signal wires coupling microelectronic device 145 to conductors of package substrate 19. Such shorter wire bond wires 131*s* may be within a Faraday cage 153. Heights of taller wire bond wires 131 may be limited to low-profile package applications.

Conductive cover 150 may be coupled to upper surface 132 of package substrate 19. Conductive cover 150 may cover components of SiP 100 coupled to upper surface 132 including microelectronic device 145, microelectronic devices 11, 12 and wire bond wires 131. Wire bond wires 131 not part of BVA arrangement 136 may interconnect conductive cover 150 and ground plane 140. This coupling may be used to reduce internal noise. However, Faraday cage 153 may be located under cover 150 for internal EMI shielding. Optionally, conductive surface 130 may be omitted in favor of using conductive cover as an upper conductive surface of Faraday cage 153, with or without a gap 144 between tips 148 and an underside of conductive cover 150.

Some wire bond wires 131 within BVA arrangement 136 may be signal wires, namely wire bond wires 131s. Wire bond wires 131s may not be coupled to ground plane 140, but may be coupled to traces (not shown) of package substrate 19. Tips of wire bond wires 131s may be bonded or soldered to microelectronic device 145 prior to use of dielectric protective material 143. In another implementation, dielectric protective material 143 may be omitted with respect to microelectronic device 145.

Wire bond wires 131s may be bonded to upper surfaces of one or more of passive microelectronic devices 12 or active microelectronic devices 11. These wire bond wires 131s may be for interconnection within SiP 100.

Figure 6:
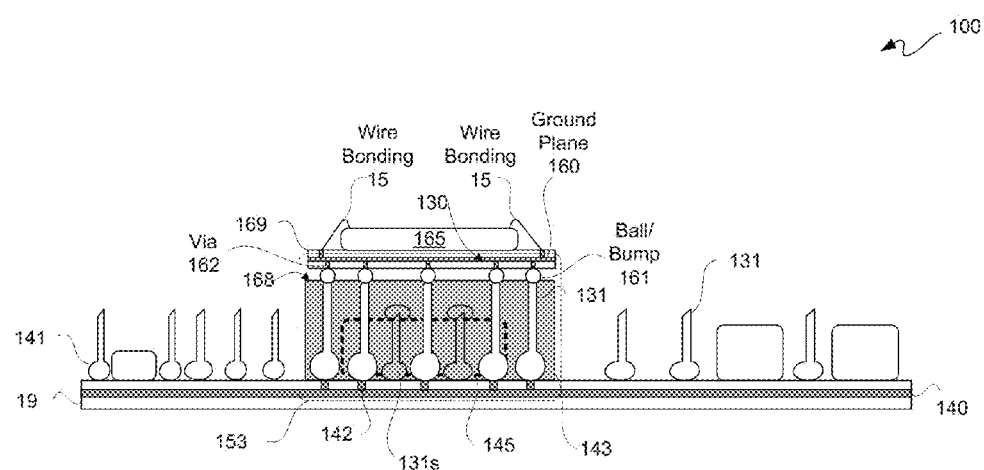
FIG. 6 is a block diagram of a cross-sectional side view depicting an exemplary SiP with EMI shielding using an upper substrate.

FIG. 6 is a block diagram of a cross-sectional side view depicting an exemplary SiP 100 with EMI shielding using an upper substrate 169. SiP 100 of FIG. 6 is the same as SiP 100 of FIG. 5, but without a conductive cover 150 and with the following differences.

Upper substrate 169 in addition to vias 162 may include a ground plane 160. Tips or upper ends 148 of wire bond wires 131 may be interconnected to vias 162 along a bottom surface of upper substrate 169 with interconnects 161, such as with micro balls or microbumps for example, for coupling to ground plane 160. Interconnects 161 may be disposed on an upper surface 168 of dielectric protective material 143. Ground plane 160 may provide an upper conductive surface 130 of Faraday cage 153.

Another microelectronic device 165, whether active or passive, may be coupled to a top surface of upper substrate 169. Microelectronic device 165 may be coupled with wire bond wires 15 to vias or traces of substrate 169. However, micro balls or microbumps may be used in another implementation. Microelectronic device 165 may be coupled outside of Faraday cage 153.

Figure 7:
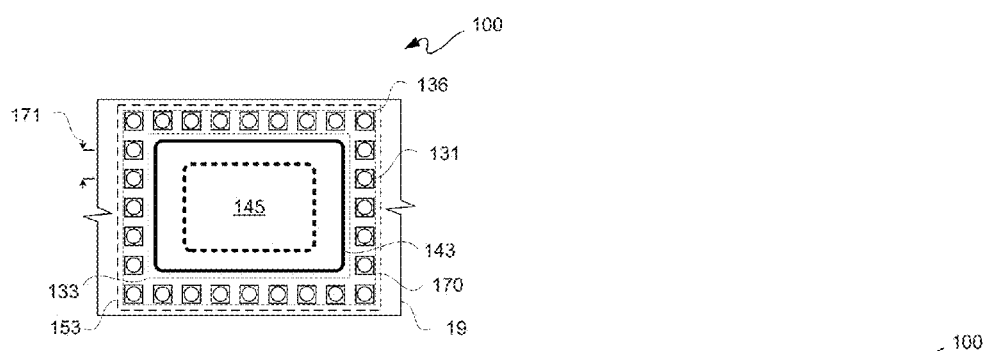
FIG. 7 is a block diagram of a top-down view depicting an exemplary portion of an SiP prior to addition of an upper conductive surface of a Faraday cage.

FIG. 7 is a block diagram of a top-down view depicting an exemplary portion of an SiP 100 prior to addition of an upper conductive surface 130 of a Faraday cage 153. Bond pads 170 may be positioned proximate to and around microelectronic device 145 for coupling wire bond wires 131 respectively thereto for providing shielding region 133 of Faraday cage 153. Shielding region 133 may be defined within a BVA arrangement 136.

Bond pads 170 may be spaced apart from one another around sides of dielectric protective material 143. Microelectronic device 145 in dielectric protective material 143 may be located in a central portion of shielding region 133. A pad-to-pad pitch 171 of bond pads 170 may be equal to or less than approximately 250 microns. Pitch 171 of bond pads 170 may be selected for frequencies associated with interference, such as EMI and/or RFI, to shield microelectronic device 145 from EMI and/or RFI. Moreover, microelectronic device 145 may be an interference radiator, and thus such shielding may be to protect other components of SiP 100 from interference generated by microelectronic device 145.

Even though single rows and columns of bond pads 170 are illustratively depicted, in another implementation there may be more than one or two rows and/or columns. Moreover, rows and/or columns of bond pads 170 may be interleaved with respect to one another to provide denser shielding. Effectively, wire bond wires 131 may be used to provide a low pass filter Faraday cage for reducing EMI with respect to operation of microelectronic device 145. Along those lines, placement of bond pads 170, and thus wire bond wires 131 may, though need not be, uniform. Wire bond wires 131 may be placed and/or adjusted for density tailored to shield a particular range of frequencies to or from microelectronic device 145.

Figure 8:
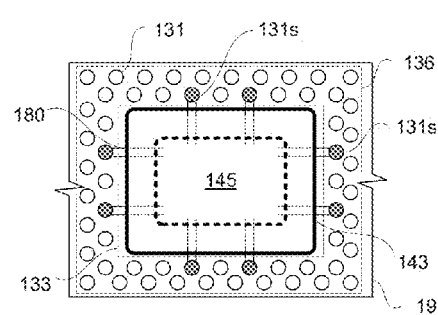
FIG. 8 is a block diagram of a top-down view depicting an exemplary portion of another SiP prior to addition of an upper conductive surface of a Faraday cage.

FIG. 8 is a block diagram of a top-down view depicting an exemplary portion of another SiP 100 prior to addition of an upper conductive surface 130 of a Faraday cage 153. In this example, two rows and two columns of a BVA arrangement 136 of wire bond wires 131 are used to define a shielding region 133. In this example, spacing between rows and columns is interleaved to provide a denser pattern of wire bond wires 131.

In this example, some of wire bond wires 131 of BVA arrangement 136 are for carrying signals, namely wire bond wires 131s. Along those lines, interconnects 180 may be formed for extending from microelectronic device 145 outside of dielectric protective material 143 for interconnection with signal wire bond wires 131s.

Figures 9A, 9B:
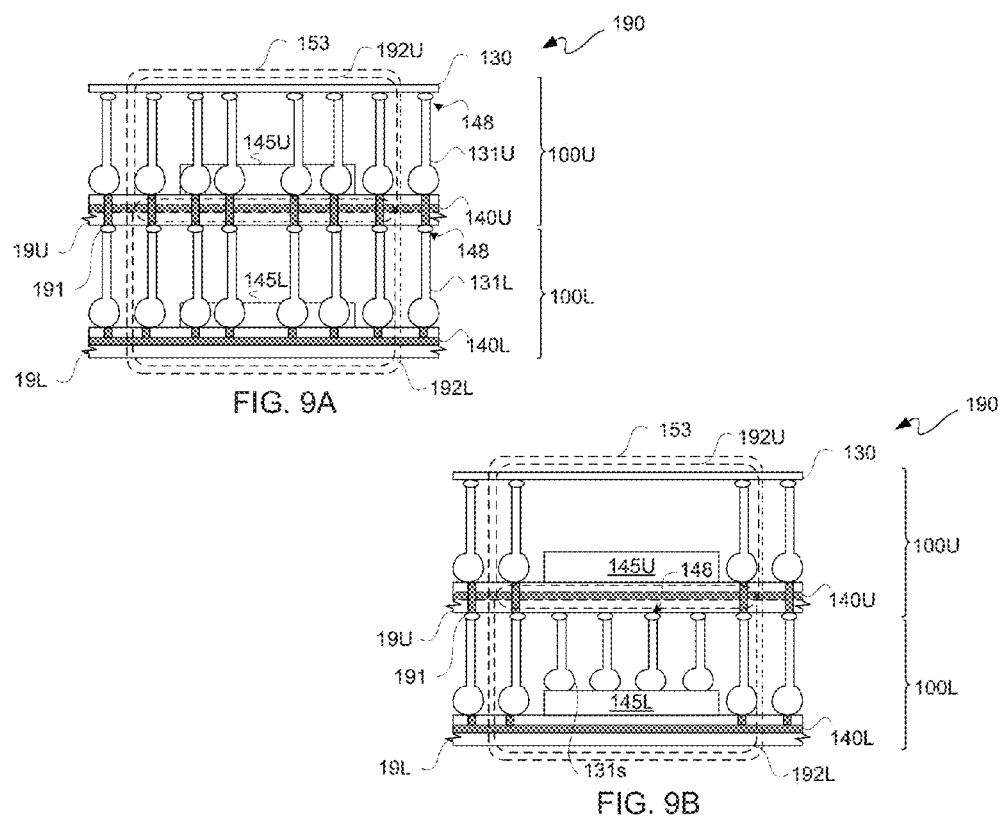
FIG. 9A is a block diagram of a cross-sectional side view depicting an exemplary portion of a package-on-package ("PoP") device with EMI shielding.
FIG. 9B is a block diagram of a cross-sectional side view depicting an exemplary portion of another PoP device with EMI shielding.

FIG. 9A is a block diagram of a cross-sectional side view depicting an exemplary portion of a package-on-package ("PoP") device 190 with EMI shielding. PoP device 190 may include an upper SiP 1000 stacked on top of a lower SiP 100L. PoP device 190 may include one or more other microelectronic devices outside of a shielding region as well as other details, such as previously described with reference to FIGS. 3A through 8 for example. Accordingly, previously described details for SiPs 100 are not described hereinbelow for purposes of clarity and not limitation.

A lower package substrate 19L of a lower SiP 100L may include a lower ground plane 140L having lower wire bond wires 131L extending upwardly from an upper surface of lower package substrate 19L. Such lower wire bond wires 131L and ground plane 140L may be interconnected to one another, such as with vias and ball bonds as previously described, for forming a lower portion of a Faraday cage 153. Tips 148 of lower wire bond wires 131L may be bonded or coupled with interconnects 191 to pads and vias therefor along an underneath side of upper package substrate 19U.

Optionally, upper package substrate 19U may include an upper ground plane 140U for forming a Faraday cage 153 as a stack of two Faraday cages, namely an upper Faraday cage 192U and a lower Faraday cage 192L. Each of Faraday cages 192U and 192L may include respective packaged microelectronic devices 145U and 145L respectively coupled to upper surfaces of package substrates 19U and 19L.

Upper ground plane 140U of upper substrate 19U may be located over a lower microelectronic device 145L, so tips or upper ends 148 of lower wire bond wires 131L may be interconnected to pads or contacts with interconnects 191 along an underside surface of upper package substrate 19U for electrical coupling to upper ground plane 140U. Upper wire bond wires 131U and optional ground plane 140U may be interconnected to one another, such as with vias and ball bonds as previously described, for forming an upper portion of a Faraday cage 153. Tips 148 of upper wire bond wires 131U may be bonded or coupled to conductive surface 130 for completing such upper Faraday cage 192U.

In another implementation, vias of upper substrate package 19U may interconnect lower wire bond wires 131L with upper wire bond wires 131U without being connected to an upper ground plane 140U to form a "two-story" or bi-level Faraday cage 153 for two microelectronic devices 145U, 145L. Even though only two levels are illustratively depicted, more than two levels may be used in other implementations.

FIG. 9B is a block diagram of a cross-sectional side view depicting an exemplary portion of another PoP device 190 with EMI shielding. PoP device 190 may include one or more other microelectronic devices outside of a shielding region as well as other details, such as previously described with reference to FIGS. 3A through 9A for example. Accordingly, previously described details for SiPs 100 are not described hereinbelow for purposes of clarity and not limitation.

PoP device 190 of FIG. 9B may be the same as PoP device 190 of FIG. 9A, except with the following differences. PoP device 190 of FIG. 9B may include signal wire bond wires 131s. Signal wire bond wires 131s may be located within Faraday cage 153, including within Faraday cage 192U.

Signal wire bond wires 131s in this configuration may extend upwardly from an upper surface of a lower microelectronic device 145L. Tips or upper ends 148 of wire bond wires 131s extending from an upper surface of lower microelectronic device 145L may be interconnected to an underneath side of upper package substrate 19U, such as with interconnects 191. Vias and/or traces (not shown) may electrically couple upper and low microelectronic devices 145 with signal wire bond wires 131s. Moreover, lower substrate package 19L may include vias and/or traces (not shown) for interconnection with lower microelectronic device 145.

Figure 10:
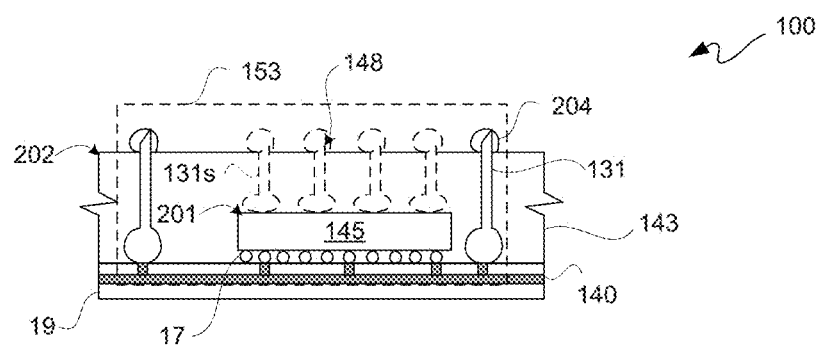
FIG. 10 is a block diagram of a cross-sectional side view depicting an exemplary portion of another SiP with EMI shielding.

FIG. 10 is a block diagram of a cross-sectional side view depicting an exemplary portion of another SiP 100 with EMI shielding. SiP 100 may include one or more other microelectronic devices outside of a shielding region as well as other details, such as previously described with reference to FIGS. 3A through 9B for example. Accordingly, previously described details for SiPs 100 are not described hereinbelow for purposes of clarity and not limitation.

In this example, wire bond wires 131 and a microelectronic device 145, such as an IC die, are protected by a dielectric protective material 143. Microelectronic device 145 may be interconnected with microbump interconnects 17 to an upper surface of package substrate 19 prior to depositing or injecting dielectric protective material 143. Likewise, wire bond wires 131 may be ball bonded to an upper surface of package substrate 19 prior to depositing or injecting dielectric protective material 143.

Optionally, signal wire bond wires 131s may be ball bonded to an upper surface 201 of microelectronic device 145 prior to depositing or injecting dielectric protective material 143. Signal wire bond wires 131s thus may be within a shielding region 133 of a Faraday cage 153.

Tips or upper ends 148 of wire bond wires 131, as well as optional signal wire bond wires 131s, may extend above an upper surface 202 of dielectric protective material 143. Solder balls or other interconnect eutectic masses 204 may be deposited onto tips 148 for subsequent interconnection, such as describe elsewhere herein.

Vertical Integration without Interference Shielding

Figure 11A:
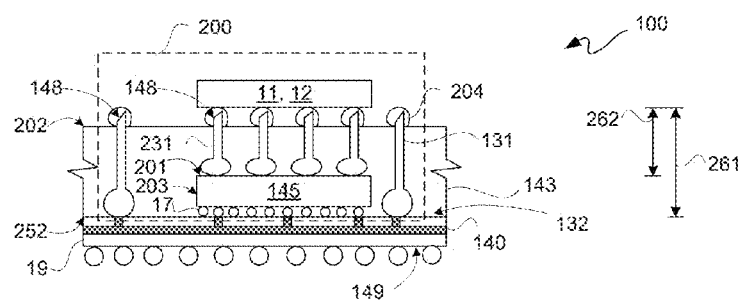
FIG. 11A is a block diagram of a cross-sectional side view depicting an exemplary portion of an SiP without wire bond wire EMI shielding.
Figure 11B:
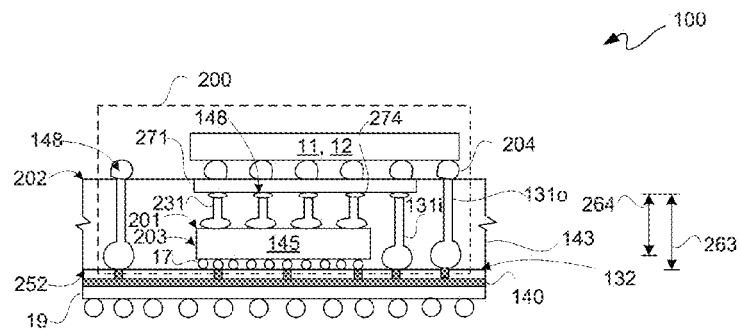
FIG. 11B is a block diagram of a cross-sectional side view depicting an exemplary portion of another SiP without wire bond wire EMI shielding.

FIG. 11A is a block diagram of a cross-sectional side view depicting an exemplary portion of an SiP 100 without wire bond wire EMI shielding. FIG. 11B is a block diagram of a cross-sectional side view depicting an exemplary portion of aSiP 100 which may or may not include EMI shielding. With simultaneous reference to FIGS. 11A and 11B, SiPs 100 respectively illustratively depicted in those figures are further described. Each of SiPs 100 may include one or more other microelectronic devices as well as other details, such as previously described. Accordingly, previously described details for SiP 100 are not described hereinbelow for purposes of clarity and not limitation.

Each of SiPs 100 includes a vertically integrated microelectronic package 200. Each of microelectronic packages 200 includes a substrate 19 having an upper surface 132 and a lower surface 149 opposite the upper surface. Package substrate 19 may have located between surfaces 132 and 149 a ground plane 140 and vias 142 interconnected to such ground plane for electrical conductivity, however, this is not a requirement.

A microelectronic device 145 may be coupled to upper surface 132 of substrate 19, where microelectronic device is an active or passive microelectronic device. Along those lines, in an SiP 100 there may be one or more of either or both passive or active microelectronic devices coupled to upper surface 132. The active or passive devices may be implemented on a semiconductor chip or may be implemented as discreet components, such as standalone capacitors, resistors, inductors, antenna, sensors, etc. If implemented in or on a semiconductor material, the component may be connected in a face up or face down configuration and may also have one or more through semiconductor vias (TSVs) coupling opposing sides of the component. According to this implementation upper surfaces of such active or passive microelectronic devices, which may in the past have gone unused for vertical integration, now include bonding wire bond wires attached to such upper surfaces of such microelectronic devices for connection to other passive or active components.

More particularly, wire bond wires 131 may be coupled to and extend away from the upper surface 132 of substrate 19, and wire bond wires 231 may be coupled to and extend away from an upper surface 201 of microelectronic device 145. Wire bond wires 131 and 231 may be mechanically coupled to upper surfaces 132 and 201, respectively, with ball bonds 141 for electrical conductivity. However, in other implementations, other types of bonding may be used. Wire bond wires 231 are shorter in length than wire bond wires 131.

With reference to FIG. 11A, wire bond wires 131 may have an overall finished length 261, and wire bond wires 231 may have an overall finished length 262. However, finished heights of wire bond wires 131 and 231 may be approximately the same for having upper ends 148 extend above an upper surface 202 of molding layer 143.

Upper ends 148 may be coterminous for being generally coplanar. Solder balls or other interconnect eutectic masses 204 may be deposited on upper surface 202 respectively over upper ends 148 for forming interconnects with pads (not shown) on a front face underside of an active or passive microelectronic device 11 or 12.

According to one implementation, microelectronic device 145 may be coupled to upper surface 132 of package substrate 19. Microelectronic device 145 may include conductive traces and may include only passive components. If implemented as a passive component, microelectronic device 145 may represent a capacitor, an inductor, or a resistor, or any combination thereof. If implemented as an active component, microelectronic device 145 may represent, e.g., a die with transistors, but additionally or alternatively may include other active or passive devices on or in the active component.

Microelectronic device 145 may be coupled to package substrate 19 with ball or bump interconnects and/or wire bond wires, as previously described. Moreover, microelectronic device 145 may be coupled to upper surface 132 with an adhesive or an underfill layer (not shown).

In the implementation shown, microelectronic device 145, as well as microelectronic device 11 or 12, have orientations facing downwardly, namely face-down orientations, toward upper surface 132 of substrate 19. However, in another implementation, microelectronic device 11 or 12 may additionally or alternatively have circuitry on a front side face facing upwardly away from an upper surface 132 of substrate 19.

A microelectronic device 11 or 12 may be coupled above uppermost surface 202 of molding layer 143. In an implementation, a microelectronic device 11 or 12 may be coupled to upper ends 148 of wire bond wires 131 and 231 with eutectic masses 204 or other mechanical interconnects. Microelectronic device 11 or 12 may be located above microelectronic device 145 and may completely overlap microelectronic device 145, at least partially overlap such microelectronic device 145, or may not overlap microelectronic device 145 at all.

Molding layer 143 may have an uppermost surface 202 and a lowermost surface 252 opposite the uppermost surface. Molding layer 143 may be disposed for surrounding portions of lengths 261 and 262 for both wire bond wires 131 and 231. Upper ends 148 may not be covered with molding layer 143, such as by use of a mold assist film for an injection molding for example. In another implementation, molding layer 143 may temporarily completely cover lengths 261 and 262 followed by an etch back to reveal upper ends 148.

In an implementation of a vertically integrated microelectronic package 200, microelectronic device 145 may be disposed in molding layer 143. Along those lines, in an implementation, microelectronic device 145 may be completely located between uppermost surface 202 and lowermost surface 252 of molding layer 143. Wire bond wires 131 may be disposed around sidewalls 203 of microelectronic device 145 though not for interference shielding in this example implementation.

Wire bond wires 131 may be coupled to ground plane 140 for projecting or extending upwardly away from upper surface 132 of package substrate 19 and may be arrayed. Along those lines, even though single rows and columns of a BVA™ arrangement of wire bond wires 131 and/or 231 may be present in an implementation, multiple rows and/or multiple columns of such wire bond wires may be in a BVA™ arrangement.

In an implementation of vertically integrated microelectronic package 200, microelectronic device 12, implemented as a passive microelectronic device, may be used. However, in another implementation of vertically integrated microelectronic package 200, microelectronic device 11 may be implemented as an active microelectronic device.

With reference to FIG. 11B, inner wire bond wires 131*i* may have an overall finished length 263, and wire bond wires 231 may have an overall finished length 264. Outer wire bond wires 1310 may have an overall finished height 261, as previously described with reference to FIG. 11A. Finished heights of wire bond wires 131*i* and 231 may be approximately the same after forming for having upper ends 148 generally even with one another.

Upper ends 148 of wire bond wires 131*i* and 231 may be coterminous for being generally coplanar. Solder balls or other interconnect eutectic masses 274 may couple a lower surface of an active or passive microelectronic device 271 respectively to upper ends 148 of wire bond wires 131*i* and 231 for forming interconnects with pads (not shown) on a front face underside of an active or passive microelectronic device 271. A molding material may be injected to form molding material layer 143 with microelectronic device 271 in place, and thus a lower surface of microelectronic device 271 may be in contact with molding material of molding layer 143. For molding, a mold assist film may be used to allow tips 148 of outer wire bond wires 1310 to extend above upper surface 202 of molding layer 143, as well as pads or other interconnects (not shown) of microelectronic device 271. In another implementation, molding layer 143 may temporarily completely cover lengths 261 followed by an etch back to reveal upper ends 148 thereof.

Microelectronic device 271 may be coupled to and located above microelectronic device 145 and may at least partially overlap microelectronic device 145. Along those lines, microelectronic device 271 may laterally extend outside a perimeter of microelectronic device 271 for interconnection of inner wire bond wires 131*i* between upper surface 132 of substrate 19 and a lower surface of microelectronic device 271 facing such upper surface 132. Wire bond wires 131*i*, as well as wire bond wires 131*o*, may be disposed around sidewalls 203 of microelectronic device 145 though not for interference shielding in this example implementation.

Again, a passive microelectronic device 145 may be coupled to upper surface 132 of package substrate 19. Microelectronic device 145 may include conductive traces and may include only passive components. A passive component may be a capacitor, an inductor, or a resistor, or any combination thereof. Microelectronic device 145 may be coupled to package substrate 19 with ball or bump interconnects and/or wire bond wires, as previously described. Moreover, microelectronic device 145 may be coupled to upper surface 132 with an adhesive or an underfill layer (not shown). If the microelectronic device is a discreet passive component, the wire 231 may be formed on a solder portion, such as a solder pad or on a copper, nickel, gold, or alloy pad.

Molding layer 143 may have an uppermost surface 202 and a lowermost surface 252 opposite the uppermost surface. Molding layer 143 may be disposed for surrounding portions of lengths 261 of wire bond wires 1310 and for surrounding lengths 263 and 264 for both wire bond wires 131*i* and 231.

In an implementation of vertically integrated microelectronic package 200, microelectronic device 145 may be disposed in molding layer 143 and completely located between uppermost surface 202 and lowermost surface 252 of molding layer 143. Microelectronic device 271 may be disposed in molding layer 143 and at least partially located between uppermost surface 202 and lowermost surface 252 of molding layer 143. Microelectronic device 11 or 12 may be coupled above uppermost surface 202 of molding layer 143.

For a passive microelectronic device 271, microelectronic device 271 may include conductive traces and may include only passive components. Microelectronic device 271 may include an RDL. A passive component may be a capacitor, an inductor, or a resistor, or any combination thereof. In this implementation, microelectronic devices 145 and 271, as well as microelectronic devices 11 or 12, have orientations facing downwardly, namely face-down orientations, toward upper surface 132 of substrate 19. However, in another implementation, microelectronic device 11 or 12 and/or microelectronic device 271 may have a front side face facing upwardly away from an upper surface 132 of substrate 19.

In an implementation of vertically integrated microelectronic package 200, microelectronic device 12, which is a passive microelectronic device, may be used. However, in another implementation of vertically integrated microelectronic package 200, microelectronic device 11, which is an active microelectronic device, may be used. A microelectronic device 11 or 12 may be coupled above uppermost surface 202 of molding layer 143 for interconnection with microelectronic device 271. In an implementation, a microelectronic device 11 or 12 may be coupled to an upper surface of microelectronic device 271 with eutectic masses 204 or other mechanical interconnects for electrical conductivity.

Microelectronic device 11 or 12 may be located above microelectronic device 271 and at least partially overlap such microelectronic device 271. Along those lines, a microelectronic device 11 or 12 may be coupled above uppermost surface 202 of molding layer 143 for interconnection with upper ends 148 of outer wire bond wires 131*o*, as well as interconnection with an upper surface of microelectronic device 271.

Wire bond wires 131*i* and 131*o* may be coupled to ground plane 140 for projecting or extending upwardly away from upper surface 132 of package substrate 19 and may be arrayed. Along those lines, even though single rows and columns of a BVA™ arrangement of wire bond wires 131*i*, 131*o*, and/or 231 may be present in an implementation, multiple rows and/or multiple columns of such wire bond wires may be in a BVA™ arrangement.

Figure 12A:
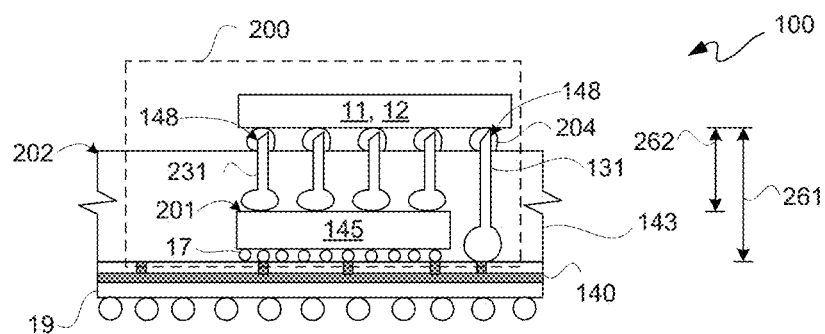
FIGS. 12A through 12D are respective block diagrams of cross-sectional side views depicting exemplary portions of respective SiPs without wire bond wire EMI shielding.

FIG. 12A is a block diagram of a cross-sectional side view depicting an exemplary portion of another SiP 100 without wire bond wire EMI shielding. SiP 100 of FIG. 12A may be the same as in FIG. 11A, except for the following details. In this implementation of a vertically integrated microelectronic package 200, microelectronic device 12 is cantilevered for laterally extending over and above a wire bond wire 131. Along those lines, upper ends 148 of wire bond wires 131 may be interconnected with eutectic masses 204 to a lower surface of a microelectronic device 11 or 12.

Figure 12B:
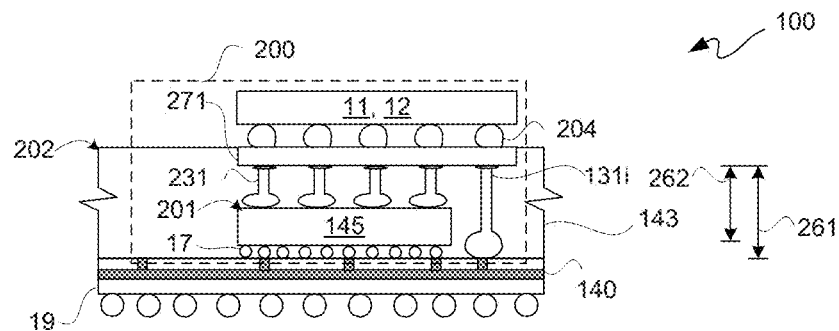

FIG. 12B is a block diagram of a cross-sectional side view depicting an exemplary portion of another SiP 100 without wire bond wire EMI shielding. SiP 100 of FIG. 12B may be the same as in FIG. 11B, except for the following details. In this implementation of a vertically integrated microelectronic package 200, microelectronic device 12 is not cantilevered for laterally extending over and above a wire bond wire 131*o*. Along those lines, a microelectronic device 11 or 12 and microelectronic device 271 may have approximately equal surface areas for lower and upper surfaces respectively thereof.

Figure 12C:
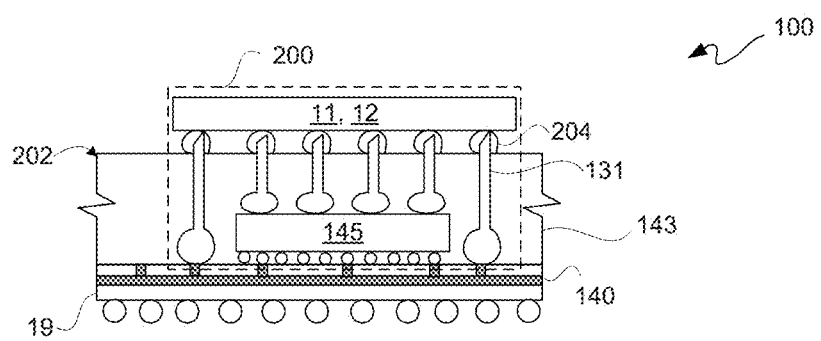

FIG. 12C is a block diagram of a cross-sectional side view depicting an exemplary portion of another SiP 100 without wire bond wire EMI shielding. SiP 100 of FIG. 12C may be the same as in FIG. 12A, except for the following details. In this implementation of a vertically integrated microelectronic package 200, microelectronic device 12 is cantilevered for laterally extending over and above wire bond wires 131 on both a right and a left side of microelectronic device 145. Along those lines, upper ends 148 of wire bond wires 131 may be interconnected with eutectic masses 204 to a lower surface of a microelectronic device 11 or 12. Accordingly, it should be appreciated that wire bond wires 131 disposed around a microelectronic device and interconnected to a microelectronic device 11 or 12 may be used for fan-out.

Figure 12D:
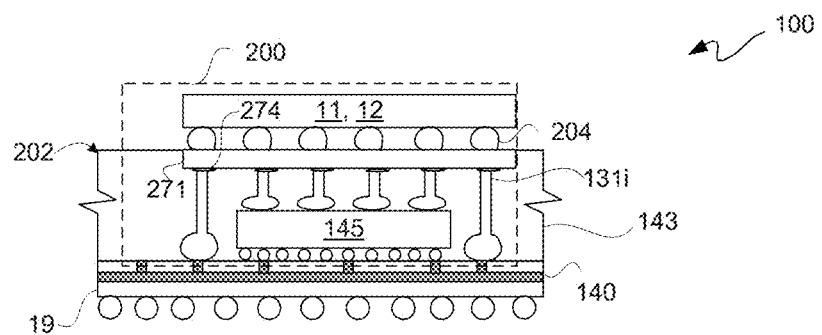

FIG. 12D is a block diagram of a cross-sectional side view depicting an exemplary portion of another SiP 100 without wire bond wire EMI shielding. SiP 100 of FIG. 12D may be the same as in FIG. 12B, except for the following details. In this implementation of a vertically integrated microelectronic package 200, microelectronic device 12 is not cantilevered for laterally extending over and above a wire bond wire 131*o*. Along those lines, a microelectronic device 11 or 12 and microelectronic device 271 may have approximately equal surface areas for lower and upper surfaces respectively thereof. Along those lines, upper ends 148 of wire bond wires 131*i* may be interconnected with eutectic masses 274 to a lower surface of a microelectronic device 271. Accordingly, it should be appreciated that wire bond wires 131*i* disposed around a microelectronic device 145 and interconnected to a microelectronic device 271 may be used for fan-out.

Figure 13A:
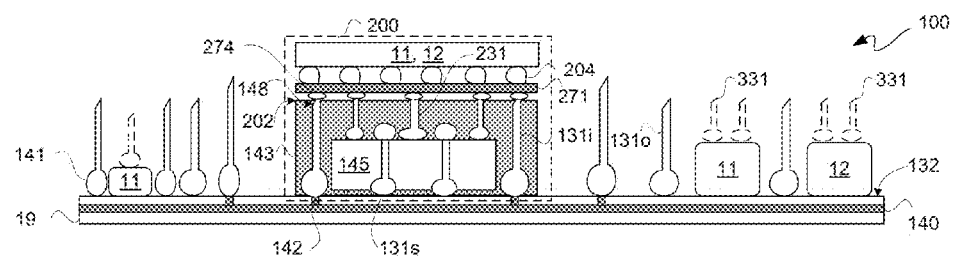
FIGS. 13A through 13D are respective block diagrams of cross-sectional side views depicting exemplary portions of respective SiPs without wire bond wire EMI shielding and with vertically integrated microelectronic packages.

FIG. 13A is a block diagram of a cross-sectional side view depicting an exemplary SiP 100 without EMI shielding and with a vertically integrated microelectronic package 200. In this implementation, a vertically integrated microelectronic package 200 may be a stand-alone package coupled to substrate 19 as in FIG. 12D of an SiP 100. As components of SiP 100 have been previously described, such as with reference to FIG. 4 for example, such description is not repeated.

In this implementation, eutectic masses 274 are formed on an upper surface 202 of molding layer 143. Eutectic masses 274 interconnect upper ends 148 of wire bond wires 131*i* and 231, which may be encapsulated in molding layer 143 except for lower and upper ends thereof, to a lower surface of microelectronic device 271. In this example, a lower surface of microelectronic device 271 is not in contact with an upper surface 202 of molding layer 143.

Moreover, in this example implementation, signal wire bond wires 131*s* may be encapsulated in molding material of molding layer 143, except for lower surfaces of such signal wire bond wires 131*s*. Signal wire bond wires 131*s* may be shorter than inner wire bond wires 131*i* and may be as previously described for interconnection with a microelectronic device 145. Along those lines, microelectronic device 271 may be coupled to upper ends 148 of a taller portion of wire bond wires 131 coupled to upper surface 132, such as wire bond wires 131*i*. Microelectronic device 271 may further be coupled to upper ends 148 of wire bond wires 231. Another portion of wire bond wires 131 coupled to upper surface 132, such as signal wire bond wires 131*s*, may have upper ends 148 thereof coupled to an upper surface of microelectronic device 145, such as previously described.

Optionally, wire bond wires 331 may be coupled to one or more upper surfaces of active microelectronic devices 11 and/or passive microelectronic devices 12 directly coupled to an upper surface 132 of substrate 19.

Other details regarding SiP 100 of FIG. 13A have been previously described, and thus are not repeated for purposes of clarity and not limitation.

Figure 13B:
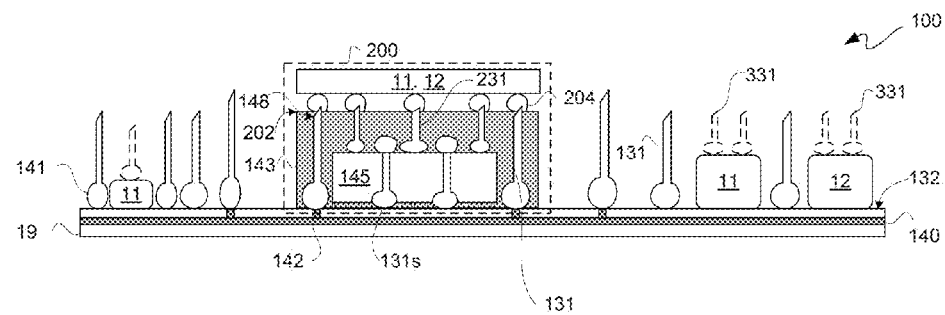

FIG. 13B is a block diagram of a cross-sectional side view depicting an exemplary SiP 100 without EMI shielding and with a vertically integrated microelectronic package 200. In this implementation, a vertically integrated microelectronic package 200 may be a stand-alone package coupled to substrate 19 as in FIG. 13A of an SiP 100. As components of SiP 100 have been previously described, such as with reference to FIG. 4 for example, such description is not repeated.

SiP 100 of FIG. 13B is similar to SiP 100 of FIG. 13A, except for the following differences. In SiP 100 of FIG. 13B, vertically integrated microelectronic package 200 omits microelectronic device 271. Thus, a microelectronic device 11 and/or 12 may be directly coupled to an upper surface 202 of molding layer 143 with eutectic masses 204, such as previously described.

Figure 13C:
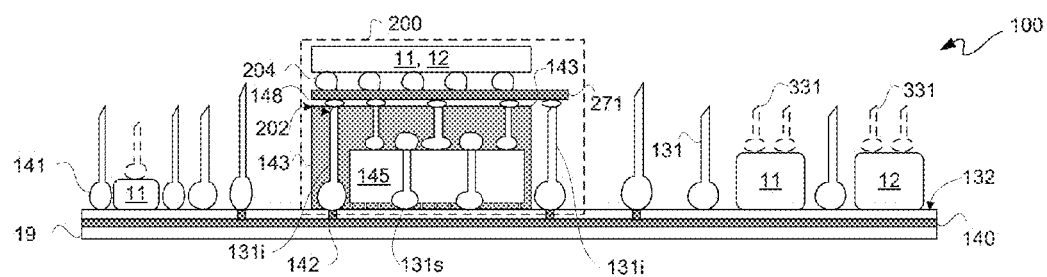

FIG. 13C is a block diagram of a cross-sectional side view depicting an exemplary SiP 100 without EMI shielding and with a vertically integrated microelectronic package 200. In this implementation, a vertically integrated microelectronic package 200 may be a stand-alone package coupled to substrate 19 as in FIG. 13A of an SiP 100. As components of SiP 100 have been previously described, such as with reference to FIG. 4 for example, such description is not repeated.

SiP 100 of FIG. 13C is similar to SiP 100 of FIG. 13A, except for the following differences. In SiP 100 of FIG. 13C, vertically integrated microelectronic package 200 has some wire bond wires 131i encapsulated in molding material of molding layer 143 as previously described and has some wire bond wires 131i not encapsulated in molding material of molding layer 143.

Figure 13D:
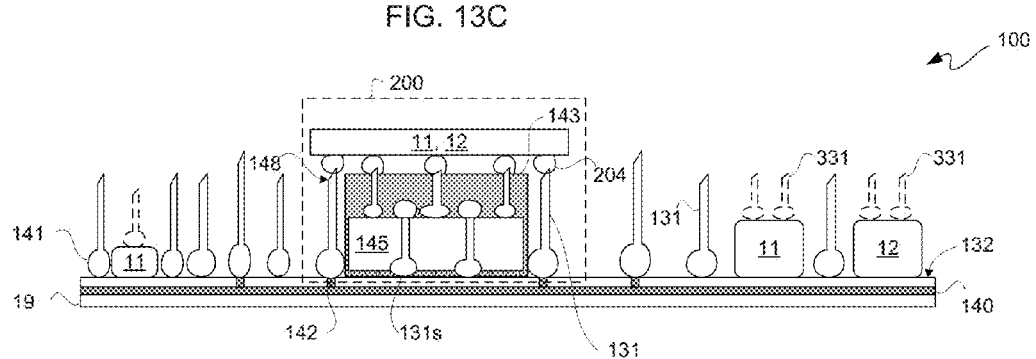

FIG. 13D is a block diagram of a cross-sectional side view depicting an exemplary SiP 100 without EMI shielding and with a vertically integrated microelectronic package 200. In this implementation, a vertically integrated microelectronic package 200 may be a stand-alone package coupled to substrate 19 as in FIG. 13B of an SiP 100. As components of SiP 100 have been previously described, such as with reference to FIG. 4 for example, such description is not repeated.

SiP 100 of FIG. 13D is similar to SiP 100 of FIG. 13B, except for the following differences. In SiP 100 of FIG. 13D, vertically integrated microelectronic package 200 does not have wire bond wires 131 encapsulated in molding material of molding layer 143.

These are some of a variety of implementations of a vertically integrated microelectronic package 200 for an SiP 100. However, these or other implementations may be provided in accordance with the description herein.

Along those lines, while the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An apparatus for a microelectronic package having protection from interference, comprising:
    a substrate having an upper surface and a lower surface opposite the upper surface and having a ground plane;
    a first microelectronic device coupled to the upper surface of the substrate;
    wire bond wires coupled to the ground plane for conducting the interference thereto and extending away from the upper surface of the substrate;
    a first portion of the wire bond wires positioned to provide a shielding region for the first microelectronic device with respect to the interference;
    a second portion of the wire bond wires not positioned to provide the shielding region;
    a second microelectronic device coupled to the substrate and located outside of the shielding region; and
    a conductive surface over the first portion of the wire bond wires for covering the shielding region.

2. The apparatus according to claim 1, wherein the conductive surface is positioned over the first portion of the wire bond wires with upper ends thereof being mechanically coupled to the conductive surface.

3. The apparatus according to claim 2, wherein the first microelectronic device includes an integrated circuit die.

4. The apparatus according to claim 2, wherein the first microelectronic device includes a passive component.

5. The apparatus according to claim 4, wherein the passive component is selected from a group consisting of a capacitor, an inductor, and a resistor.

6. The apparatus according to claim 1, wherein an interconnected combination of the ground plane, the conductive surface, and the first portion of the wire bond wires provides a Faraday cage.

7. The apparatus according to claim 1, further comprising a conductive cover coupled to the upper surface of the substrate, the conductive cover covering the first microelectronic device, the second microelectronic device, the conductive surface, and the wire bond wires.

8. The apparatus according to claim 1, further comprising:
    bond pads positioned proximate to and around the first microelectronic device on the upper surface of the substrate for coupling the first portion of the wire bond wires thereto for the shielding region; and
    the bond pads having a pad-to-pad pitch equal to or less than approximately 250 microns.

9. The apparatus according to claim 1, wherein the substrate and the ground plane respectively are a first substrate and a first ground plane, the apparatus further comprising:
    a second substrate having a second ground plane;
    upper ends of the first portion of the wire bond wires coupled to a bottom surface of the second substrate for coupling to the second ground plane; and
    a third microelectronic device coupled to a top surface of the second substrate.

10. An apparatus for a microelectronic package having protection from interference, comprising:
    a substrate having an upper surface and a lower surface opposite the upper surface and having a ground plane;
    a microelectronic device coupled to the upper surface of the substrate;
    wire bond wires bonded to and extending away from the upper surface of the substrate;
    a first portion of the wire bond wires having a first height and positioned proximate to and around the microelectronic device for providing a shielding region for the microelectronic device with respect to the interference, the first portion of the wire bond wires coupled to the ground plane for conducting the interference thereto;
    a second portion of the wire bond wires having a second height less than the first height and positioned proximate to and around the microelectronic device, the second portion of the wire bond wires including signal wires for electrically coupling the microelectronic device with the substrate;
    a conductive surface over the wire bond wires for covering the shielding region; and
    upper ends of the first portion of the wire bond wires mechanically coupled to the conductive surface.

11. The apparatus according to claim 10, wherein the microelectronic device is a first microelectronic device, the apparatus further comprising a second microelectronic device coupled to the substrate and located outside of the shielding region.

12. The apparatus according to claim 10, further comprising:
    bond pads positioned proximate to and around the microelectronic device on the upper surface of the substrate for coupling the wire bond wires thereto; and
    the bond pads having a pad-to-pad pitch equal to or less than approximately 250 microns.

13. The apparatus according to claim 10, wherein the substrate, the ground plane and the microelectronic device respectively are a first substrate, a first ground plane and a first microelectronic device, the apparatus further comprising:
- a second substrate located over the first microelectronic device and having a second ground plane as the conductive surface, the second substrate located over upper ends of the wire bond wires; and
- a second microelectronic device coupled to a top surface of the second substrate.

14. The apparatus according to claim 10, wherein an interconnected combination of the ground plane, the conductive surface, and the first portion of the wire bond wires provides a Faraday cage.

15. An apparatus for a microelectronic package having protection from interference, comprising:
- a substrate having an upper surface and a lower surface opposite the upper surface and having a ground plane;
- a first microelectronic device coupled to the upper surface of the substrate;
- lower ends of wire bond wires coupled to the ground plane for conducting the interference thereto;
- a first portion of the wire bond wires positioned to provide a shielding region for the first microelectronic device with respect to the interference;
- a second portion of the wire bond wires not positioned to provide the shielding region;
- a second microelectronic device coupled to the substrate and located outside of the shielding region; and
- a conductive surface having the first portion of the wire bond wires coupled thereto, the conductive surface covering the shielding region and defining the shielding region with the first portion of the wire bond wires extending away from the conductive surface.

16. The apparatus according to claim 15, further comprising:
- bond pads positioned proximate to and around the first microelectronic device on the upper surface of the substrate for coupling the lower ends of the wire bond wires thereto for providing the shielding region for the microelectronic device with respect to the interference; and
- the bond pads having a pad-to-pad pitch equal to or less than approximately 250 microns.

17. The apparatus according to claim 15, wherein an interconnected combination of the ground plane, the conductive surface, and the first portion of the wire bond wires provides a Faraday cage.

18. The apparatus according to claim 15, wherein the substrate and the ground plane respectively are a first substrate and a first ground plane, the apparatus further comprising:
- a second substrate having a second ground plane;
- ball bonds of the first portion of the wire bond wires coupled to a bottom surface of the second substrate for coupling to the second ground plane as the conductive surface; and
- a third microelectronic device coupled to a top surface of the second substrate.

19. The apparatus according to claim 15, wherein the first microelectronic device includes an integrated circuit die.

20. The apparatus according to claim 15, wherein the first microelectronic device includes a passive component.

* * * * *